DYNAMIC BISTABLE OR CONTROL CIRCUIT

Filed March 7, 1957

INVENTOR.
HOWARD D. HELMS
BY Morris [signature]
ATTORNEY

United States Patent Office 2,964,646
Patented Dec. 13, 1960

2,964,646

DYNAMIC BISTABLE OR CONTROL CIRCUIT

Howard D. Helms, Princeton, N.J., assignor to Radio Corporation of America, a corporation of Delaware Filed Mar. 7, 1957, Ser. No. 644,583

9 Claims. (Cl. 307—88)

This invention relates to a dynamic circuit having a bistable characteristic and, if desired, a sensitive input-output characteristic.

This invention is an improvement over the copending application Serial No. 644,582, filed March 7, 1957, concurrently herewith by E. O. Keizer and assigned to the assignee of this application. The circuit of the present invention relies, as in the above-mentioned Keizer application, upon the variable capacitance characteristic of a semi-conductor junction. When driven by a high frequency A.-C. source, a circuit according to the subject invention may be arranged to have either a bistable characteristic and to be suitable, for example, as a dynamic memory element, or a voltage or light sensitive input-output characteristic suitable, for example, for control or detection purposes.

The present invention is similar in operation to circuits utilizing either the ferromagnetic or the ferroelectric effect. Dielectric amplifiers, for example, operate on the principle of controlling, by a low power source, the A.-C. reactance of a capacitance element. A kind of duality which exists between magnetic and dielectric amplifiers utilizing the ferromagnetic and the ferroelectric effects, respectively, is set forth in an article entitled, "Dielectric Amplifier Fundamentals," appearing on page 84 of the December 1951 issue of "Electronics." In the kind of circuits discussed in the article, it would be desirable to employ higher frequencies and to relieve the circuits of temperature dependent characteristics. Further, it is desirable to provide a simple A.-C. energized bistable circuit requiring only a few elements, for example, an inductor, a capacitor, and a variable capacitance junction diode.

It is an object of this invention to provide an improved dynamic circuit employing a variable capacitance semiconductor device, which circuit is more sensitive than those heretofore known.

Another object of this invention is to provide an improved dynamic bistable circuit.

A further object of this invention is to provide an improved A.-C. energized bistable circuit.

In accordance with this invention, circuits are disclosed which make use of the rectifier characteristic and voltage-sensitive junction-capacitance characteristic of semi-conductor devices. In one embodiment of the invention, two semi-conductor junctions are placed back-to-back in a series circuit with an inductor and the circuit energized with a high frequency A.-C. source to provide a sensitive bistable or control circuit. In another embodiment of the invention, a junction transistor is substituted for the two back-to-back junction diodes mentioned above.

The novel features of this invention as well as the invention itself, both as to its organization and method of operation, will best be understood from the following description, when read in connection with the accompanying drawings, in which like reference numerals refer to like parts, in which.

Figure 4:
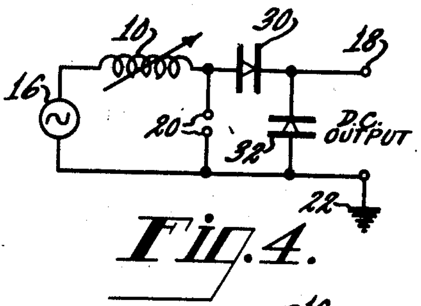
Figure 4 is a circuit diagram illustrating an embodiment of the invention in which two variable capacitance junction diodes are placed back-to-back in a series circuit.
Figure 5:
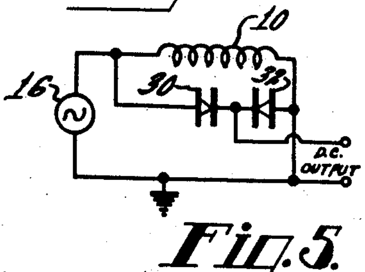
Figures 6, 7:
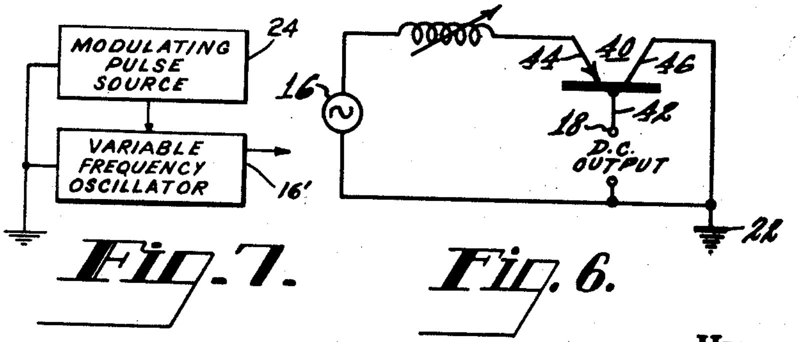

Figure 5 is a circuit diagram illustrating an embodiment of the invention in which two variable capacitance junction diodes are placed back-to-back in a parallel arrangement; and Figure 6 is a circuit diagram illustrating another embodiment of this invention in which a junction transistor is substituted for the two junction diodes of the circuit of Figure 4; and Figure 7 is a block diagram of a variable frequency oscillator and means for pulse modulating said oscillator.

Figure 1:
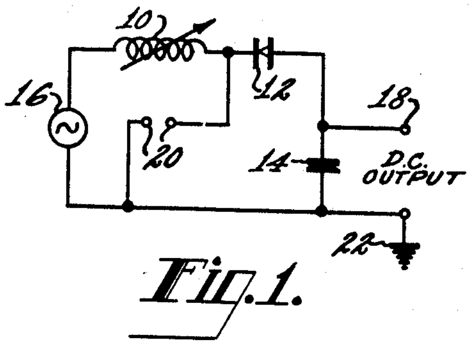
Figure 1 is a circuit diagram of a simple form of series fed bistable or control circuit.

The nature and theory of operation of the resonant circuit of Figure 1 are more fully described in the above-mentioned Keizer application. The description of this circuit and its operation given here, however, are only sufficient to provide an understanding of the improvements made by the present invention.

In Figure 1, an inductor 10, a variable-capacitance junction-diode 12, and a capacitor 14 are connected in series with a high frequency source 16 of constant-frequency variable-amplitude alternating current (A.-C.). The capacitor 14 and inductor 10 are standard circuit elements of their respective types. The inductor may have a core or not. The A.-C. source 16 may be any type of high frequency, low internal impedance voltage source capable of providing an output of several mill-watts. A suitable A.-C. source may be, for example, a transistor oscillator whose output is coupled through an emitter follower amplifier to the circuit of Figure 1. The A.-C. source should provide a path for direct current flow for reasons that will become apparent. For providing bistable operation, the A.-C. source 16 may be capable of providing a variable voltage-amplitude, output level or a variable frequency.

The variable capacitance junction diode 12 may be a diode of the type described in an article entitled, "A Variable Capacitance Germanium Diode for UHF," by Giacoletto and O'Connell, appearing on page 221 of "Transistor I," published March 1956, by RCA Laboratories, Princeton, New Jersey. In the Giacoletto article, it is stated that a junction of two dissimilar semi-conductors constitutes a diode in which, if biased in the reverse (non-conducting) direction, the mobile charge carriers are moved away from the junction, leaving uncompensated fixed charges in a region near the junction. From this, it is apparent that the width and hence the electrical charge of this region (spaced charge layer) depends on the applied voltage, thereby giving rise to a junction transition capacitance. In this regard, it may be noted that the desired capacitance for a particular bias voltage determines the area of the junction.

This particular capacitive effect, given by a junction or present at a junction of two dissimilar semi-conductive materials, is also described on page 12 of the book "Principles of Transistor Circuits" by R. F. Shea, published October, 1953, by John Wiley and Sons, Inc., which states, "The barrier charge increases with voltage, and therefore, the barrier has a capacitance. The rapid transition junction has an effective A.-C. capacitance which is universely proportional to the square root of V. The graded junction capacitance is inversely proportional to the cube root of V." It is known that, in addition to the above-identified capacitive effect, a junction of two dissimilar semi-conductive materials, such as between the so-called P type material in which conduction is principally by holes, and the so-called N type material in which conduction takes place principally by electrons, forms an efficient rectifier. The diode 12 in Figure 1 is poled so that the capacitor 14 is charged negatively by the rectifying action of the diode. One side of the A.-C. source is connected to a point of reference potential, such as ground 22. Outputs from the circuit of Figure 1 may be taken from across the capacitor 14 from an output terminal 18 with respect to ground 22.

The operation of the circuit of Figure 1 is based on the combined effects of rectification and the voltage-sensitive variable capacitance of the diode 12. When supplied with an alternating potential by the A.-C. source 16, the diode 12 rectifies this A.-C. potential to charge the capacitor 14 negatively with respect to ground 22 to provide its own direct current (D.-C.) reverse bias. As stated above, because of the polarity of the diode 12, the negative peaks of the alternating voltage from the A.-C. source 16 are rectified, thereby providing a negative charge on the capacitor 14, which appears as a negative output at the output terminals 18 with respect to ground. This negative charge which builds up across the capacitor 14 functions to reverse bias the diode 12. A resistive load or some other D.-C. path is provided across the capacitor 14 to allow the charge to leak off. In practice, such leakage may take place through the back resistance of the diode 12, through the leakage resistance of the capacitor 14, or through the load placed between the D.-C. output terminal 18 and ground 22. As the reverse bias is increased, the capacitance at the junction of the junction diode 12 decreases and, correspondingly, the capacitive reactance of the diode 12 increases. This effect enables the circuit to have two stable states of operations if the frequency provided by the input voltage source 16 is within the series resonant range as determined by the inductance of inductor 10 and the capacities of the diode 12 and capacitor 14.

Figure 2:
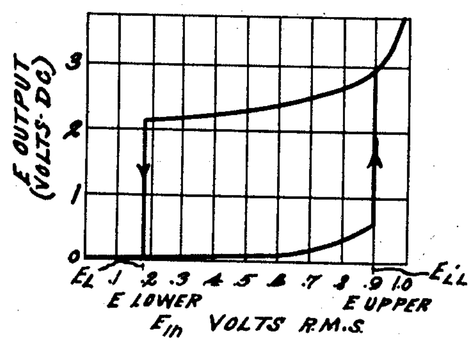
Figure 2 is a curve illustrating a typical bistable characteristic resulting from the circuit of Figure 1.

The two stable states are illustrated by the curve in Figure 2. In Figure 2, the ordinate is the negative D.-C. output voltage with respect to ground 22 appearing at the D.-C. output terminal 18 of Figure 1. The ordinate in Figure 2 thus represents the charge built up in the capacitor 14 or the magnitude of reverse bias across the diode 12. Alternating current input voltage amplitude of the A.-C. source 16 is represented on the abscissa in Figure 2. The curves in Figure 2 were obtained by first gradually increasing, then gradually decreasing, the amplitude of the voltage of the A.-C. input from the A.-C. source 16. It is apparent from Figure 2 that, for certain input voltage levels or amplitudes, two D.-C. outputs of widely different voltages are possible. The circuit may be triggered between these two stable states by voltage pulses, temporary input level or frequency changes (a change in frequency varies the responses of the circuit elements and thus the rectified output voltage), or by other means. The frequency at which the circuit triggers may be termed the critical frequency. In the lower one of these two stable states of voltage output, the series resonant frequency of the circuit is slightly below the frequency of the A.-C. source 16 and the circuit presents an inductive load to the A.-C. source 16. In the other state of higher voltage output, the circuit presents a capacitive load to the A.-C. source 16, passing through resonance abruptly, in transition, when triggered or when a critical amplitude of frequency is reached. The minimum time required for transition has been found in one circuit to be in the order of three to ten cycles of the exciting frequency. It may be noted from the curve of Figure 2 that the D.-C. output voltage is larger than the R.M.S. of the applied A.-C. voltage. This difference in voltages exists because the applied A.-C. voltage is of a frequency near resonance for the series circuit of the indicator 10, capacitance-diode 12 and capacitor 14.

Figure 3:
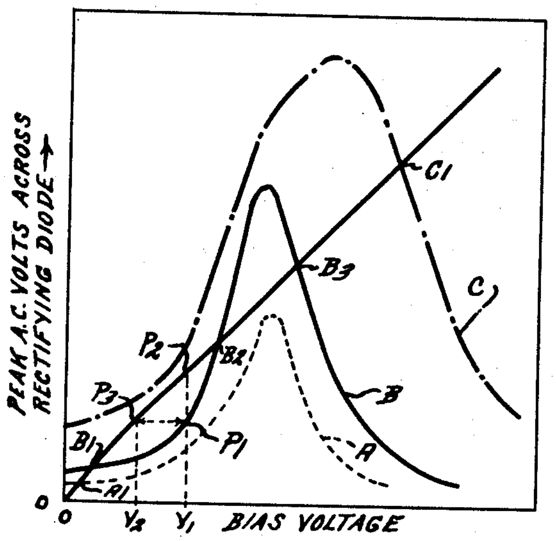
Figure 3 illustrates the curves showing the response of the variable capacitance junction diode of Figure 1 to various biases obtained in operation with various input voltage levels.

The operation of the bistable circuit of Figure 1 is more readily understood with the aid of Figure 3. The approximately straight line A1, B2, B3, C1 at an angle through the origin represents the reverse bias developed by diode rectification as related to the peak A.-C. voltage across the diode 12. This approximately straight line shows the rectification characteristic only and disregards the capacitive effect of the junction diode. Thus, the curves of Figure 3 are plotted with the negative reverse bias voltage developed across the diode of Figure 1 as the abscissa and the peak A.-C. voltage across the diode as the ordinate. The remaining curves A, B, and C in Figure 3 are response curves illustrating the manner in which the A.-C. voltage across the diode varies as the reverse bias is changed (thus changing the capacity of the diode). Note that curves A, B, and C pertain to the variable capacitance characteristic of the diode only and assume that there is no diode conduction. The several curves A, B, and C, respectively, are plotted for different A.-C. input voltage levels. For example, curve A is for a relatively small A.-C. input voltage level, curve B is for an A.-C. input voltage level larger than that of curve A, and curve C is for an A.-C. input voltage level larger than that of either curve A or B.

Each of these curves A, B, C is a plot of the peak A.-C. voltage across the diode considered as a reactance, which reactance is a function of the bias voltage. Although there is a relationship between bias voltage and capacitive reactance, the relationship is not simple or direct, as pointed out by the Shea article, cited hereinbefore. We know that as reverse bias voltage increases, the capacity of the diode decreases. From our knowledge of the response of resonant circuits, as the capacity decreases (with the reverse bias), and the capacitive reactance increases, the peak A.-C. voltage across the diode should follow a curve such as A, B, or C, depending on the amplitude of the voltage at the source 16. Thus, the curves A, B, C are, in a sense, reactance curves. All steady state operating points must fall on a point of intersection between the approximately straight, bias versus A.-C. curve and the response curve corresponding to the A.-C. input level being supplied.

A detailed consideration of the intermediate response curve B, shown as a solid line, will clarify the reasons that certain intersections of the approximately straight line and the other curves may be stable operating points, whereas other intersections may be unstable operating points.

In Figure 3, there are three points of intersection, B1, B2, and B3, of the response curve B with the reverse bias straight line. Two of the points, B1 and B3, are stable points. The middle point, B2, is unstable. If the circuit is momentarily in the region of B2, it will immediately jump to that one of the stable operating points, B1 or B3, on the same side of the intermediate point B2 as the initial point. In this, as in all cases, the circuit moves from the initial operating point to the stable operating point on the same side as the initial point from the middle point. Such is the case when the circuit is first energized by the A.-C. source 16 and the operating point moves to the stable operating point, B1.

The stability of a stable operating point, such as B1, comes from the equilibrium between bias voltage and peak A.-C. volts across the rectifying diode 12, considered solely as a reactance. If the initial operating point on the curve B falls between the points B1 and B2, for example, at P1, the peak A.-C. volts across the diode is less than that which sustains by rectification a rectified D.-C. of the corresponding value V1, as may be verified by reference to the point P2 on the straight line curve.

Instead, the lower peak A.-C. volts at point P1 causes a rectified D.-C. bias voltage V2 corresponding to the point P3. With this lower bias voltage, however, again the peak A.-C. volts across the diode is less than that which sustains by rectification a rectified D.-C. voltage of the value corresponding to this new point P3. For reasons similar to those set forth above, the operating point continues to move to the left, until the peak A.-C. volts across the diode corresponds to the rectified D.-C. reverse bias voltage, which correspondence is at the operating point B1. However, if the initial operating point is to the left of B1, the response curve shows that the peak A.-C. volts is greater than the peak A.-C. volts given by the reverse bias straight line, causing movement of the operating point to the right, which continues until equilibrium is reached at the stable operating point B1.

A similar analysis may be made for the stable point B3 to show that for points on curve B to the right of B3 the operating point is driven to the left until the stable point B3 is reached. The converse is true for points between B2 and B3, whereupon the operating point is driven to the right to point B3.

In summary, once the operating point reaches a stable operating point, the circuit will remain at that stable point, except when something is done to the circuit to upset equilibrium.

If the circuit is initially in a low level state, for example, at the stable operating point B1 which corresponds to $E_L$ (E lower) in Figure 2, and the input voltage level is raised above the upper critical level denoted as $E_u$ (E upper) in Figure 2, an abrupt increase in output results as the circuit passes through series resonance and the corresponding stable point B3 Figure 3 is reached.

The point B2 represents an unstable operating point since at this point any increase in the applied voltage provides a resulting increase in the reverse bias appearing across the diode 12. Also, any decrease in the applied voltage provides a corresponding decrease in the reverse bias developed by the diode. Either of these effects is cumulative so that the circuit operating point is driven to either of the stable points B1 or B3.

The significance of the upper critical level $E_u$ of Figure 2 may be better explained by a further consideration of the curves of Figure 3. Assume that the input level of the A.-C. source 16 is temporarily shifted from that of curve B to that of curve C. Assume also that the circuit of Figure 1 is presently operating at the stable point B1. With the input level shift, the increase in response voltage results in a continuing increased reverse bias across the diode 12 until the stable point C1 is reached. Once the temporarily increased input level is decreased to that of the curve B, the operating point of the circuit falls back to the stable point B3. Thus, if the circuit is initially in a low level state and the input level is raised through this upper critical level ($E_u$, Figure 2), an abrupt increase in the output will occur. If, however, the circuit is in an initially high level state as represented by the point B3, for example, an increase in the input level will have a relatively small effect on the output, such as shifting from a stable point B3 to another nearby stable point C1.

A reduction of the input below the lower critical level ($E_L$ as illustrated in Figure 2) will result in the circuit returning to a low level state as, for example, stable point B1, abruptly if it had previously been in the high level state, for example, stable point B3. This particular action is more easily described by assuming that the A.-C. source 16 input level corresponding to curve B of Figure 3 is momentarily shifted down to the input level corresponding to curve A. It is noted that the response curve A has no intersection with the diode bias curve in the B3 region. The lower critical level ($E_L$, Figure 2) has thus been exceeded and with the reduced voltage available for rectification across the diode 12, the reverse bias falls until the stable point A1 is reached. With the return of the input level back to that of B, the operating point changes to B1.

The bistable circuit of Figure 1 may be triggered from either of its two stable states to the other by applying, from an external source, a bias voltage across the diode 12, by pulse amplitude modulating the A.-C. source 16, by varying the frequency of the A.-C. source 16 and thus the response of the elements making up the bistable circuit, or by coupling another input frequency to the circuit through a transformer in place of the inductor 10, which input frequency is either in phase or out of phase with the A.-C. source 16; other methods will be apparent to those skilled in the art. Variation of the frequency of the A.-C. source 16 varies the responses of the reactive elements 10, 12, and 14. With sufficient frequency variation, the circuit operating at point B1 may be caused to pass through series resonance to a point corresponding to B3. When the frequency is returned to normal, the operating point remains at B3. Thus for a given constant input A.-C. voltage level in the bistable region, there are also upper and lower critical frequencies. These critical frequencies are determined by the circuit parameters and the range over which the capacitance of the diode 12 may be varied.

Figure 7 is a block diagram of a variable frequency oscillator 16′ and a modulating pulse source coupled to the oscillator 16′. The oscillator 16′ may be, for example, a transistor oscillator arranged to provide variable frequency output signals, and may be the A.-C. source 16 of Figure 1. The modulating pulse source 24 may be any suitable pulse source for pulse modulating the oscillator 16′.

Although the values are given by way of illustration, and are not intended as limiting, one successful circuit, as illustrated in Figure 1, was operated in which the following values were employed: The inductor 10 was 100 microhenrys; the capacitor 14 was 300 micromicrofarads; and the variable capacitance junction diode 12 was of the type described in the "Transistor I" article having sufficient capacitance to form a resonant circuit with the inductor 10 and capacitor 14 at 1.95 megacycles as input.

An A.-C. output from the circuit may be taken from between the A.-C. output terminal 20 and ground 22. The voltage magnitude of the A.-C. output is representative of the stable states of operation, as is apparent from the A.-C. response curves of Figure 3. In the bistable case, the circuit may find use as a memory element, as a switch, or other applications wherein a bistable characteristic is necessary or desirable.

As in many resonant circuits, the "Q" of the circuit of Figure 1 at the source frequency has a considerable effect upon the performance characteristics. It should be pointed out that to obtain a large ratio of upper to lower critical voltage amplitudes, a high "Q" (ratio of the reactance to resistance) circuit is needed. As the "Q" is reduced, for example, by raising the source resistance or by resistive loading of the A.-C. output 20 or the D.-C. output 18, the critical amplitudes move closer together. When the "Q" has thus been reduced beyond a critical point, the upper and lower critical voltages coincide and for this critical "Q" and for lower "Q's" the circuit is no longer bistable. However, in this region the output amplitude is very sensitive to changes in source frequency, source amplitude, or to control signals applied, for example, across the variable capacitance diode 12 of Figure 1. The circuit function in this instance is similar to that of a dielectric amplifier. As such, the circuit may find use in control or detector applications. For example, if the input level is held constant as by a limiter, a sensitive frequency discriminator is formed.

Referring to Figure 4, an embodiment in accordance with the present invention employing two back-to-back (poled in opposite directions) diodes 30 and 32, is shown. Each of the diodes 30 and 32 is of the same type as the variable capacitance diode 12 of Figure 1 and these diodes 30 and 32 and the variable inductor 10 are connected in series with each other. The A.-C. source 16 is connected across the resulting series circuit. One terminal of the A.-C. source 16 is coupled to ground 22, as indicated. A D.-C. output may be taken from across the variable capacitance diode 32. In a similar manner, an A.-C. output may be obtained from the terminals 20.

It should be noted that the circuit of Figure 4 employs the variable capacitance diode 32 in place of the fixed capacitor 14 of Figure 1, and otherwise the circuits of Figures 1 and 4 are similar. The variable capacitance diode 30 is so poled as to rectify the positive peaks of the alternating waveform from the source 16, so that the output appearing at the D.-C. output terminal 18 is positive with respect to ground 22. Thus, in the presence of an exciting frequency from the A.-C. source 16, a reverse bias is built up across each of the variable capacitance diodes 30 and 32, respectively. Such configuration increases the sensitivity of the circuit, since the capacitance of both diodes 30 and 32 varies simultaneously with any self bias built up by the rectifying action of the diode 30. With the exception that both diodes 30 and 32 have a variable capacitance characteristic, the circuit operates much the same as that of Figure 1 and no further explanation is deemed to be necessary.

With the use of the back-to-back diodes 30 and 32 the circuit has an increased sensitivity resulting in a higher ratio of the upper to the lower critical voltages (Figure 2). The higher ratio of the upper to the lower critical voltages $E_u$ to $E_L$ allows the use of a circuit having a lower "Q" (it will be recalled that lower "Q's" tend to reduce the ratio of $E_u$ to $E_L$), resulting in several advantages. One of these advantages is that an A.-C. source, such as A.-C. source 16, may be employed which has a higher internal impedance. Another is that a lower resistance can be placed across the D.-C. output point (between the D.-C. output terminal 18 and ground 22). In this regard, it may be noted that lower resistances allow the use of a wider variety of indicating or utilization devices. Also with a lower output resistance the time constant T=RC at the D.-C. output point 18 is smaller than that of the circuit of Figure 1 for two reasons. First, the capacitance is smaller since the necessary large fixed capacitor has been replaced by the low capacitance of the diode 32 and, second, the loading resistor can be made smaller as mentioned above. Since the time constant of the D.-C. output point is very nearly equal to the time required to shift between the high and low D.-C. output voltages (corresponding to the two states of operation of the bistable circuit of Figure 4), the operating speed of the circuit is increased.

If desired, the back-to-back diodes may be coupled on either side of the inductor. In other circuit applications, the two back-to-back diodes of Figure 4 may be coupled in parallel with the inductor to form a parallel resonant bistable circuit, as in Figure 5. A suitable current source 16, which may have a high internal impedance, may be employed. The circuit of Figure 5 is similar to the parallel resonant circuit disclosed in Figure 8 of the above mentioned Keizer application. Its operation will be understood from what has been said heretofore.

A single transistor can be used in much the same manner as the back-to-back diode arrangement of Figure 4. Thus, in Figure 6 a PNP junction transistor 40 having a base electrode 42, an emitter electrode 44, and a collector electrode 46 is substituted for the back-to-back diodes 30 and 32 of Figure 4. In this circuit, the emitter-base junction 44—42 and the collector-base junction 46—42 replace the two junction diodes 30 and 32, respectively. The D.-C. output in this case is taken from between the D.-C. output terminal 18 connected to the base electrode 42 of the transistor 40 and ground 22. The remainder of the circuit is substantially the same as in Figure 4.

In operation, however, the circuit of Figure 6 is not exactly the equivalent of the circuit of Figure 4 due to the transistor action that results from current injection at one or both junctions of the transistor. Also, the two junctions of the transistor may have dissimilar characteristics. With these exceptions, however, the circuit operates in the same manner as the circuits of Figure 1 and Figure 4 to provide either a bistable operation or a sensitive control operation. The circuit may be shifted from one of the stable states to the other in the same manner as set forth above for the circuit of Figure 1, such as by changes in frequency, source amplitude, or control signals applied across either the emitter-base junction 44—42 or the collector-base junction 46—42 of the transistor 40.

There has thus been described a simple, high speed, efficient dynamic bistable or control circuit which may find many applications, such as in memories, ring counters, shift registers, or in control and modulating circuits. These and many other applications of the circuit will be apparent to one skilled in the art, as well as other modifications thereof.

What is claimed is:

1. The combination of an inductor and two voltage-sensitive, variable capacitance junctions connected in a series path with said junctions being poled back-to-back in said path, said combination being resonant within a range of frequencies determined by the inductance of said inductor and the capacitances of said junctions, said junction capacitances being determined by the reverse biases across said junctions; and means for applying to said combination alternating current signals having a frequency within said range and having an amplitude sufficient to reverse bias the one and the other of said junctions alternately on alternate half cycles of said alternating current signals.

2. The combination of an inductor and two voltage-sensitive, variable capacitance junctions connected in a series path with said junctions being poled back-to-back in said path, said junctions each having a forward direction of current conduction and a capacitance that varies with the reverse bias across the respective junction; means for energizing said combination with alternating current signals of sufficient amplitude to first forward bias and to then reverse bias the one and the other of said junctions alternately; and means for switching selectively the resonant frequency of said combination from one side of the alternating current signal frequency to the other side of said signal frequency.

3. The combination comprising: an inductor; two voltage-sensitive, variable capacitance junctions serially connected back-to-back, said inductor being connected in parallel with said two serially connected junctions to form a parallel circuit resonant within a range of frequencies, the exact resonant frequency of said parallel circuit being a function of the reverse biases across said junctions; and means for energizing said parallel circuit with alternating current signals having a frequency within said range and an amplitude sufficient to forward bias and reverse bias said junctions alternately.

4. The combination of an inductor and two voltage-sensitive, variable capacitance diodes connected in a series path with said diodes being poled back-to-back in said path, said inductor and said diodes being resonant at one of certain frequencies determined primarily by the capacitances of said diodes and the inductance of said inductor, the one resonant frequency depending upon the reverse biases across said diodes, and means for energizing said combination with alternating current signals at one of said certain frequencies and with a signal amplitude sufficient to forward bias one of said diodes on odd half cycles of said signals and to forward bias the other of said diodes on even half cycles of said signals.

5. In combination, a pair of junction points, the series combination of an inductor and two voltage-sensitive, variable capacitance diodes connected in series with each other between said junction points with said diodes poled back-to-back, said diodes each having a capacitance that varies with the reverse bias thereacross, said series combination being tunable within a range of resonant frequencies by varying the reverse biases across said diodes; and means for applying across said junction points alternating current signals having a frequency within said range and an amplitude sufficient to alternately forward bias and reverse bias each of said diodes out of phase with each other.

6. The combination of an inductor and two variable capacitance diodes connected in a series path with said diodes being poled back-to-back in said path, said combination having a range of resonant frequencies, the exact resonant frequency being determined by the reverse biases across said diodes; and means for energizing said combination with alternate positive and negative signals having a frequency within said range and an amplitude such that a first of said diodes is forward biased and the other of said diodes is reverse biased in response to each of said positive signals and said first of said diodes is reverse biased and said other of said diodes is forward biased in response to each of said negative signals.

7. The combination of an inductor and two voltage-sensitive, variable capacitance junctions connected in a series path with said junctions being poled back-to-back in said path, said junctions each having a forward direction of current conduction and a capacitance that varies with the reverse bias across the junction; means for energizing said combination with alternating current signals of sufficient amplitude to forward bias and reverse bias the one and the other of said junctions alternately; and means for selectively varying the amplitude of said alternating current signals to tune said combination from a first resonant frequency on one side of the alternating current signal frequency to a second resonant frequency on the other side of said alternating current signal frequency.

8. The combination of an inductor and two voltage-sensitive, variable capacitance junctions connected in a series path with said junctions being poled back-to-back in said path, said inductor and said junctions being resonant at one of certain frequencies depending upon the reverse biases across said junctions; means for energizing said combination with alternating current signals of one of said certain frequencies and of an amplitude sufficient to alternately forward bias and reverse bias said junctions out of phase with each other; and means for altering momentarily the frequency of said signals.

9. The combination comprising: a transistor having a collector-base diode and an emitter-base diode; an inductor, said inductor and both of said diodes being connected in series with each other to form a series resonant circuit, the resonant frequency of said series circuit being tunable within a range by varying the reverse biases across said diodes; and means for energizing said resonant circuit with alternating current signals having a frequency within said range and an amplitude sufficient to alternately forward bias and reverse bias the one and the other of said diodes.

References Cited in the file of this patent

UNITED STATES PATENTS

| | | |
|---|---|---|
| 2,182,377 | Guanella | Dec. 5, 1939 |
| 2,517,960 | Barney | Aug. 8, 1950 |
| 2,629,833 | Trent | Feb. 24, 1953 |
| 2,675,474 | Eberhard | Apr. 13, 1954 |
| 2,691,074 | Eberhard | Oct. 5, 1954 |
| 2,704,792 | Eberhard | Mar. 22, 1955 |
| 2,714,702 | Shockley | Aug. 2, 1955 |
| 2,760,109 | Schade | Aug. 21, 1956 |
| 2,763,832 | Shockley | Sept. 18, 1956 |
| 2,888,648 | Herring | May 26, 1959 |

OTHER REFERENCES

Shea: Principles of Transistor Circuits, pp. 10–12.

UNITED STATES PATENT OFFICE

CERTIFICATION OF CORRECTION

Patent No. 2,964,646 December 13, 1960

Howard D. Helms

It is hereby certified that error appears in the above numbered patent requiring correction and that the said Letters Patent should read as corrected below.

Column 2, line 71, for "universely" read -- inversely --.

Signed and sealed this 16th day of May 1961.

(SEAL)
Attest:

ERNEST W. SWIDER
Attesting Officer

DAVID L. LADD
Commissioner of Patents